United States Patent

[11] 3,569,758

[72] Inventors Shigeharu Horiuchi
Yokohama-shi;
Shigeo Tsuji, Fujisawa-shi, Japan

[21] Appl. No. 816,210
[22] Filed Apr. 15, 1969
[45] Patented Mar. 9, 1971

[73] Assignee Tokyo Shibaura Electric Co., Ltd.,
Kawasaki-shi, Japan

[32] Priority Apr. 18, 1968
[33] Japan
[31] 43/25,519

[54] SEMICONDUCTOR PHOTO-ELECTRIC CONVERTING DEVICES HAVING DEPRESSIONS IN THE SEMICONDUCTOR SUBSTRATE AND IMAGE PICKUP TUBES USING SAME
12 Claims, 8 Drawing Figs.

[52] U.S. Cl. .......... 313/66, 317/235
[51] Int. Cl. .......... H01j 31/28, H01l 15/00
[50] Field of Search .......... 313/65 (AB), A, 66; 317/235

[56] References Cited
UNITED STATES PATENTS

| | | | |
|---|---|---|---|
| 3,458,782 | 7/1969 | Buck et al. .......... | 313/65 |
| 3,460,007 | 8/1969 | Scott .......... | 317/235 |

*Primary Examiner*—Roy Lake
*Assistant Examiner*—V. Lafranchi
*Attorney*—Flynn and Frishauf

ABSTRACT: A semiconductor target for use in a pickup tube includes a semiconductor substrate, on one side of which is formed arrays of a plurality of depressions and which has a corresponding number of PN junctions formed along the depressions.

SEMICONDUCTOR PHOTO-ELECTRIC CONVERTING DEVICES HAVING DEPRESSIONS IN THE SEMICONDUCTOR SUBSTRATE AND IMAGE PICKUP TUBES USING SAME

BACKGROUND OF THE INVENTION

The present invention relates to a semiconductor photoelectric converting device, particularly one bearing a large number of PN junctions, and an image pickup tube involving such a device.

Noting that a photoelectric converting device containing PN junctions formed in a substrate of a semiconductor material such as silicon or germanium presents a high photon quantum efficiency and makes appreciably quick responses to light, there has been proposed an image pickup tube wherein there are formed near the surface of a substrate of single crystal silicon a large number of separate PN or NPN junctions in a mosaic pattern for use as a target, using the planar techniques known in the manufacture of semiconductor devices.

This prior art image pickup tube indeed has the advantage that it is relatively free from residual images and has a great gain, but it is handicapped by the fact that its light sensitivity is limited to those lights having wavelength projected from the infrared region or vicinity thereof. It is known that it is possible to improve spectral characteristics associated with light having short waves, namely, the visible region by reducing the thickness of a target used in an image pickup tube. In practice, however, there are encountered tremendous technical difficulties in forming, for example, a mechanically strong single crystal substrate about 1 inch in diameter to a uniform extremely small thickness.

It is accordingly an object of the present invention to provide a semiconductor photoelectric converting device sensitive to visible light, prepared by utilizing the PN junctions of a semiconductor material.

Another object of the invention is to provide an image pickup tube sensitive to visible light involving a target which is designed to have a resolving power and accumulation effect by mosaic arrangement of PN junctions in a single crystal semiconductor substrate.

Still another object of the invention is to provide an image pickup tube whose target consists of a semiconductor substrate having sufficient mechanical strength to be held securely and being sensitive to visible light.

Further objects of the present invention will be apparent from the following description of the specification and drawings.

SUMMARY OF THE INVENTION

According to the present invention, there is formed in a semiconductor substrate a large number of separate depressions in a mosaic pattern and a corresponding large number of PN junctions in the depressions. The depressions reduce the thickness of portions of the substrate while the other parts of the substrate are allowed to retain a desired thickness, so that the substrate as a whole can be rendered not only sensitive to visible light but also mechanically strong.

DETAILED DESCRIPTION OF THE INVENTION

Figure 1:
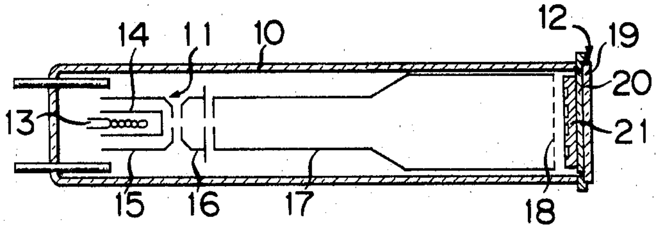
FIG. 1 is a section of a vidicon-type image pickup tube involving a semiconductor photoelectric converting device according to an embodiment of the present invention.
Figure 2:
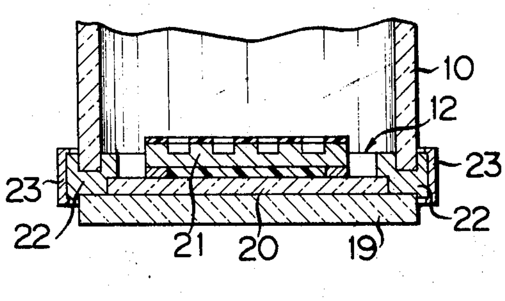
FIG. 2 is an enlarged fragmental sectional view of the image pickup tube of FIG. 1, particularly indicating a manner in which the photoelectric converting device is disposed therein.

Referring now to FIGS. 1 and 2, there will now be described a pickup tube, especially a vidicon according to an embodiment of the present invention.

The vidicon comprises a vacuum vessel 10 containing an electron gun section 11 and a photosensitive target section 12. The electron gun section 11 comprises a heater 13, a cathode 14 surrounding the heater, and a control grid electrode 15 and an accelerating electrode 16 both disposed coaxially with the cathode 14. An electrode 17 is mounted coaxially with said accelerating electrode 16, and a mesh electrode 18 is disposed opposite to said cathode at one end of the electrode 17. The photosensitive target section 12 comprises a transparent glass substrate 19, a transparent conductive layer 20 deposited on said substrate 19, and a semiconductor photoelectric converting device or photoconductive target 21. Said target 21 is provided on the transparent conductive layer 20 to face the mesh electrode 18.

There will now be described an example of attaching of the target by reference to FIG. 2 in particular.

There is first formed on the face plate 19 the transparent conductive layer 20 using Nesa coating or by vapor deposition of metal and the target 21 is adhered to the transparent conductive layer 20. Then a metal electrode or target ring 23 formed around the target 21 and layer 20 is electrically connected. As in the sealing of a general type vidicon, a vacuum vessel 10 and face plate 19 are sealed with indium 22 by a cold or indium sealing method, and the target ring 23 is electrically connected to the semiconductor target 21.

Figure 3:
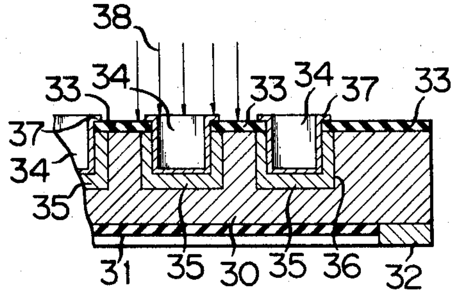
FIG. 3 is a further enlarged fragmental sectional view of the photoelectric converting device of FIGS. 1 and 2.
Figure 4:
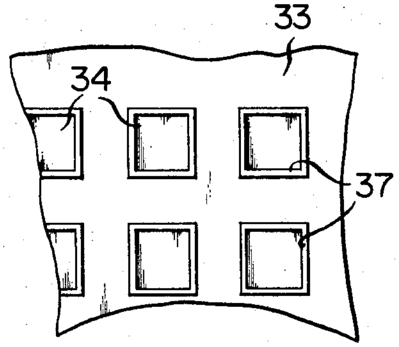
FIG. 4 is a further enlarged fragmental plan view of said device.

There will now be described by reference to FIGS. 3 and 4 the construction of the photosensitive target 21 used in the aforementioned pickup tube and its manufacturing method.

On one side of the N-type silicon substrate 30 having a specific resistivity of 5 to 80Ωcm. and containing a donor dopant of $7.5 \times 10^{13}$ to $10^{15}$ /cm.$^3$ is formed, for example, by photolithographic techniques an insulation layer 33 such as silicon dioxide film having a large number of small square holes arranged in mesh form. In those parts of the substrate 30 where there are disposed these many small holes are formed by a selective etching method a large number of small square depressions 34. Through these small depressions 34 is diffused boron into the substrate 30 to form a large number of separate P-type diffusion regions 35 around said depressions 34. Between the substrate 30 and P-type region 35 are formed PN junctions 36 in parallel to the depressions 34. If, in this case, there are formed a large number of PN junctions, that is, a large number of the small depressions, there can be increased resolving power of the target.

The etchant used in the selective etching to form the aforementioned small depressions 34 consists of a mixture of HF and HNO3($HF: HNO_3 = 2:50$) (This etchant etches a silicon dioxide film at the rate of 0.08 micron/min. and a silicon film at the rate of 2.5 micron/min.). Where there is to be formed in the silicon substrate 30 a small depression 30 microns deep, it is required that the silicon dioxide film be at least more than 1 micron thick. Generally, however, a silicon dioxide film more than 1 micron thick is liable to crack. Accordingly, where there are formed in the silicon substrate 30 small depressions (for example, more than 30 microns deep), it will be sufficient to deposit in advance, for example, acid-proof organic photosensitive materials or acid-proof metals on a silicon dioxide film made into a mesh form.

Further, it is possible to vapor-deposit for example aluminum for use as metal electrodes 37 on the P-type regions 35 formed in the aforesaid depressions 34 or not only on said P-type regions 35 but also on the insulative layer 33 in such a manner as to prevent the P-type regions 35 from being electrically connected to each other or to avoid reduction in the resolving power. Formation of this metal electrode 37 enables the semiconductor target to have an increased capacity to receive electron beans 38 from an electron gun 11, thus eliminating the occurrence of shading and residual image.

On the opposite side is deposited a silicon monoxide film. The film except for the peripheral edge, is coated with wax and the silicon monoxide film on the peripheral edge is removed by etching. The wax is taken off to expose the remaining part of the silicon monoxide film, which is used as a antireflection film 31. On that part of the silicon substrate from which the silicon monoxide film was removed, namely the peripheral edge, is mounted a metal by vapor deposition or plating to form a target electrode 32.

Figure 5:
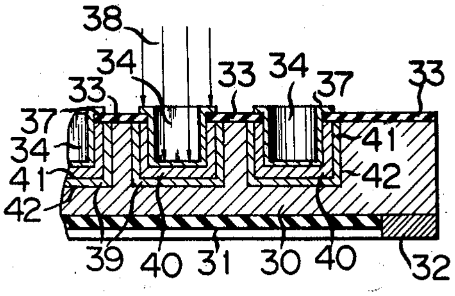
FIG. 5 is an enlarged fragmental sectional view of a photoelectric converting device according to another embodiment of the invention.
Figure 6:
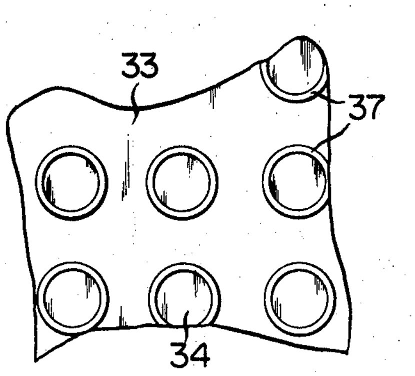
FIG. 6 is an enlarged fragmental plan view of the device of FIG. 5.

There will now be described by reference to FIGS. 5 and 6 a semiconductor target according to another embodiment of the present invention from which it is possible to obtain an amplified output so that it increases sensitivities and photo quantum efficiencies. The same parts of FIGS. 5 and 6 as those of the foregoing embodiment are denoted by the same numerals and description thereof is omitted. A large number of separate small depressions 34 formed on one side of the N-type semiconductor substrate 30 assume a columnar form and are in a regular arrangement at a proper space from each other. Through these depressions 34 there are formed by diffusion a P-type diffusion layer 39 in the silicon substrate 30 and an N-type layer 40 in said P-type layer 39 to form PN junctions 41 and 42 parallel to each other.

A large number of depressions 34 formed in the semiconductor substrate characterizing the present invention are not necessarily required to have a regular arrangement as described above, but they may be disposed in a disorderly or mosaic pattern.

Figure 7:
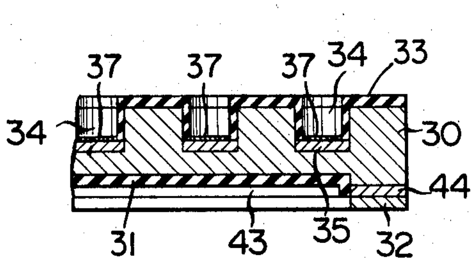
FIG. 7 is an enlarged fragmental section of a photoelectric converting device according to still another embodiment of the invention.

As far as the foregoing description is concerned, the semiconductor target of the present invention has a PN junction formed all over the inner surface of each of the small depressions, namely, on both bottom and side wall thereof. However, when the PN junction is formed only at the bottom of the small depression, the fundamental effect of the present invention can be obtained more clearly. It is also possible to form a plurality of small depressions or a single large depression on that side of the semiconductor substrate where they were not previously formed, to such extent that the substrate is prevented from being mechanically damaged. A concrete example of this embodiment is presented in FIG. 7. The same parts of FIG. 7 as those of the foregoing embodiments are denoted by the same numerals and description thereof is omitted. On one side of the N-type silicon substrate 30 are formed a large number of small depressions 34. Along the bottom of each depression 34 in the substrate is formed a P-type layer 35 by selective diffusion. In this case, on the upper surface of the substrate 30 and the inner surface of the depressions 34 is formed a silicon oxide layer 33 in a well-known manner. The part of the layer 33 disposed on the bottom surface of the depression is removed and a metal electrode 37 is formed on the removed part as in the aforementioned embodiment. On the other side of the substrate 30 excluding the peripheral portion is formed a single large depression or recess 43. This depression 43 is formed to a proper depth, because if it is formed to an appreciable depth, it is likely to cause the substrate to be mechanically damaged. The depth of said small depressions 34 may be relatively shallow. When the number of the separate depressions 34 is increased, there results an increase in the resolving power. On the exposed surface of the large depression 43 is formed a silicon monoxide film 640 to 700 A. thick which acts as an antireflecting film 31. On the peripheral portion of the side of the substrate, where there is not formed the silicon monoxide film 31, is formed an N+ layer 44, for example, by diffusion of phosphorus. On the N+ layer 44 is formed a target electrode 32 of gold or nickel to give an ohmic contact.

As described above, formation of a large number of depressions in a semiconductor substrate substantially reduces the distance covered by minority carriers in the substrate, generated by incident light in travelling through the substrate to reach the PN junction, thus making it possible to obtain a semiconductor photoelectric converting device sensitive to visible light. Due to utilization of the PN junctions formed in the depressions in the photoelectric converting device, said device has a high photo quantum efficiency and makes high frequency responses to light. Further, the semiconductor substrate constituting said device can be so prepared as to be relatively thick except at the depressions, so that it has excellent mechanical strength and prolongs the life of pickup tube whose target consists of said device.

Figure 8:
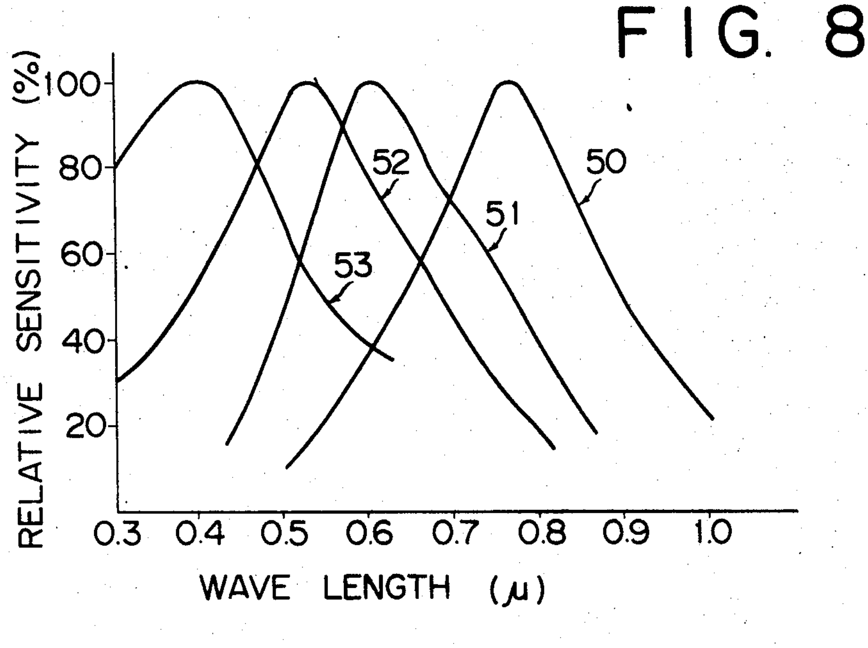
FIG. 8 is a diagram presenting the sensitivity to spectral light of the prior art photoelectric converting device and that of the present invention.

There will now be described by reference to FIG. 8 the relationship between the distances from the light receiving surface to the PN junctions (the effective thickness of the N-type silicon substrate) and the relative spectral sensitivity. In FIG. 8, the abscissa denotes the wavelength (microns) of incident light and the ordinate represents the relative sensitivity (%). The curves 50, 51, 52 and 53 respectively indicate the relative sensitivities when the aforementioned effective thickness is 30 $\mu$, 12 $\mu$, 8 $\mu$ and 1 $\mu$. In this case, the P-type diffusion region has a diffusion depth of 2 $\mu$. As apparent from FIG. 8, the shorter the distance from the light receiving plane of the PN junction, the nearer to the short wave side can be brought the peak value of the characteristic curves. It is also seen from FIG. 8 that the most suitable effective thickness of a pickup tube target which is sensitive to visible light is about 8 $\mu$. If, in this case, the P-type diffusion region has a depth of 2 $\mu$, then the substrate will be required to be as thin as 10 $\mu$. Heretofore, however, it has been impossible to use such a thin substrate as a pickup tube target in terms of mechanical strength. Now the present invention can provide a target which has such a small effective thickness so as to maintain sufficient mechanical strength for practical purposes and which gives a high sensitivity at a short wavelength region.

There will now be described an example of the target of the present invention. There is prepared an N-type silicon substrate 50$\mu$ thick. (The semiconductor techniques of the present day can easily produce single crystal silicon wafers of such thickness. The substrate is coated with a silicon dioxide film.) The silicon dioxide film is perforated with a large number of holes 4 $\mu$ in diameter at a prescribed spacing. The substrate is etched by the etchant used in the aforementioned embodiments to form depressions 40 $\mu$ deep and about 60 $\mu$ in diameter. If there is formed a P-type diffusion layer 2 $\mu$ deep in these depressions, then the distance from the PN junction to the light receiving plane of the substrate will be 8 $\mu$. In this case, it is preferred from the standpoint of improving the resolving power that the pitch of the P-type diffusion layers be reduced as much as possible, for example, to 70 $\mu$, insofar as they are not electrically connected. In a semiconductor target of the invention, it is possible to form a plurality of separate small depressions on one side of a semiconductor substrate and the corresponding number of PN junctions in those parts of the opposite side of said substrate which face said depressions.

As mentioned above, a pickup tube using a photoelectric converting device according to the present invention presents very excellent properties.

In the foregoing embodiments of the invention, the photoelectric converting device particularly consists of an N-type silicon substrate, but may also be prepared from other types of semiconductor material such as P-type silicon, germanium, or compound semiconductors.

We claim:

1. A semiconductor photoelectric converting device comprising:

a semiconductor substrate having two opposite sides, a plurality of separate depressions being formed in said substrate on one of said two opposite sides of said substrate; and a plurality of separate PN junctions formed in said depressions in said substrate and parallel at least to the bottom planes of said depressions.

2. A photoelectric converting device according to claim 1 wherein that side of the substrate in which there are formed said depressions is covered with a protective film, except for said depressions.

3. A photoelectric converting device according to claim 1 wherein said PN junctions include portions parallel to the bottom plane of the depressions.

4. A photoelectric converting device according to claim 1 wherein the PN junctions include portions parallel to the bottom plane of the depressions and another portion parallel to the peripheral plane thereof.

5. A photoelectric converting device according to claim 1 wherein the PN junctions include two parallel units for each depression.

6. A photoelectric converting device according to claim 3 wherein the inner surfaces of the depressions are coated with a metal layer.

7. A photoelectric converting device according to claim 4 wherein the inner surfaces of the depressions are coated with a metal layer.

8. A photoelectric converting device according to claim 5 wherein the inner surfaces of the depressions are coated with a metal layer.

9. A photoelectric converting device according to claim 1 wherein there is formed a target electrode on the periphery of the opposite side of the substrate, and the remaining parts of said opposite side are coated with an antireflecting film.

10. A semiconductor photoelectric converting device according to claim 1 wherein said substrate has a recess on the other side thereof in the vicinity of said separate depressions.

11. An image pickup tube comprising a vacuum bulb, an electron gun assembly fitted to the inside of one end of the bulb; a face plate disposed at the other end of the bulb to face the electron gun assembly; a transparent conductive material deposited on the inside of the face plate; a photosensitive target mounted on the transparent conductive material positioned between the face plate and electron gun assembly; said target comprising a semiconductor substrate having two opposite sides, a large number of separate depressions formed on one of said two opposite sides of the substrate, and a large number of separate PN junctions formed in the separate depressions in said substrate and parallel at least to the bottom planes of said depressions, and being electrically connected to the transparent conductive material.

12. A semiconductor photoelectric converting device according to claim 1 wherein the distance between the PN junction and the one side of the substrate on which the depression is not formed is 8 $\mu$.